Feb. 3, 1959 A. E. ARNOLD, JR 2,871,549

METHOD OF ASSEMBLING ELECTRICAL COMPONENTS

Filed June 29, 1955

INVENTOR.
ALBERT E. ARNOLD JR.
BY

W. E. Thibodeau, A. W. Dew + H. J. Forman
Attorneys

United States Patent Office 2,871,549

Patented Feb. 3, 1959

2,871,549

METHOD OF ASSEMBLING ELECTRICAL COMPONENTS

Albert E. Arnold, Jr., Moorestown, N. J.

Application June 29, 1955, Serial No. 519,010

6 Claims. (Cl. 29—155.5)

Figure 1:
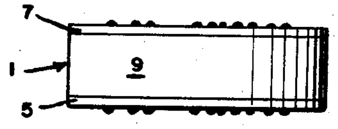

(Granted under Title 35, U. S. Code (1952), sec. 266)

The invention described herein may be manufactured and used by or for the Government for governmental purposes without the payment of any royalty thereon.

The present invention relates to manufacturing a composite unit and more particularly to a method of assembling an electrical unit of the "sandwich" type wherein a plurality of components having leads extending from the ends thereof are supported in parallel, spaced apart relation between two plates.

Present day requirements in the electronic field are directed toward simplification, space-saving, and, in particular, rapid replacement units for apparatus which is relied upon for maximum operating time. The "sandwich" type unit has been found highly useful in fulfilling these requirements because a large number of components can be accommodated in a minimum of space. The assembly is readily adaptable to printed circuit techniques by arranging the components in selected fashion and connecting their electrical leads or wires to printed circuit connections provided on the plates between which the components are disposed. In this way a composite electrical unit can be provided which, when connected circuitwise, can function as a complete stage or portion of an electronic apparatus. The unit may then be adapted as a plug-in type of unit which can quickly and easily be replaced, when found to be defective, without searching for and replacing a particular component in the stage affected. In this way, loss of operating time is kept to a minimum.

Although the advantages of this type of unit or assembly are well recognized in the art, difficulty is encountered in putting the parts together. It is recognized that there is no difficulty encountered in threading the leads of the components through openings in one of the plates between which they are to be disposed. However, it is extremely difficult and time consuming to thread the leads at the opposite ends of the components through the openings in the other end plate while maintaining the first mentioned leads within the first mentioned end plate openings. While industry has attempted different methods to facilitate this assembly, a hand operation, wherein individual leads are threaded one at a time through the second plate, appears to have been the most satisfactory.

Therefore, a primary object of the present invention is to provide a method of assembly for units of the type above mentioned which will enable assembly operations to be quickly and easily accomplished.

Another object of the present invention is to provide a method of assembling a plurality of components to provide a "sandwich" type unit which will overcome the above as well as other disadvantages of prior art assembly techniques.

Still another object of the present invention is to provide a method of assembling a plurality of electrical units which is positive in operation and is achieved with a minimum of effort and operations.

A further object of the present invention is to provide a method of assembling a plurality of components into a composite unit which is adaptable to both manual and automatic production methods.

It is also an object of the present invention to provide a method of assembling a plurality of components into a composite unit which can be quickly and cheaply accomplished with a minimum of equipment.

In accordance with the present invention, the method proposes providing a catacomb having a plurality of apertures extending therethrough for receiving the components and a pair of end plates therefor having apertures therethrough correspondingly located with respect to the catacomb apertures and through which the component leads are extended. Assembly is accomplished by supporting the catacomb above one of the end plates, inserting the components into the catacomb, and supporting the other end plate above the upwardly extending component leads. The catacomb is then moved up to the other end plate and then the first mentioned end plate is brought up to the catacomb to influence the upwardly extending leads through the other end plate openings and dispose the components within the catacomb.

Figure 5:
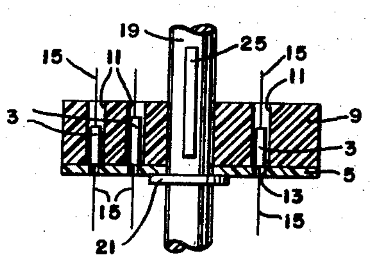
Figure 2:
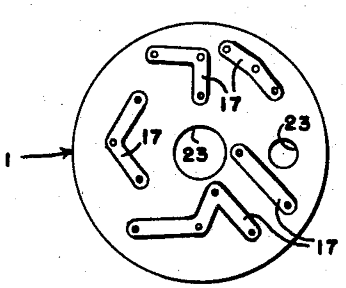
Figure 6:
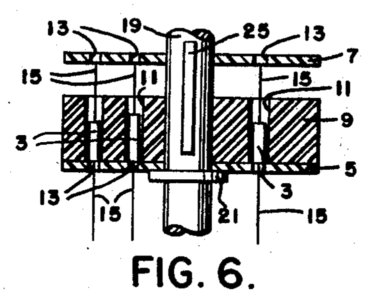
Figure 7:
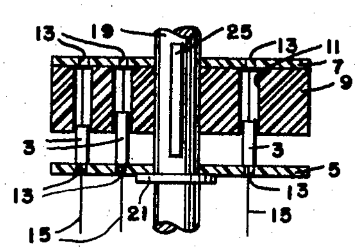
Figure 3:
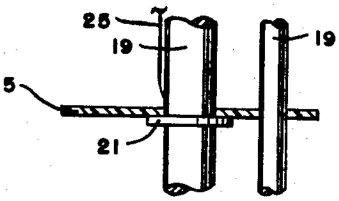
Figure 8:
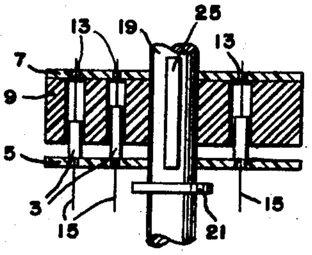
Figure 9:
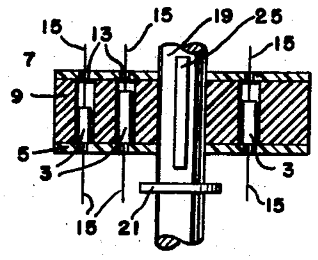
Figure 4:
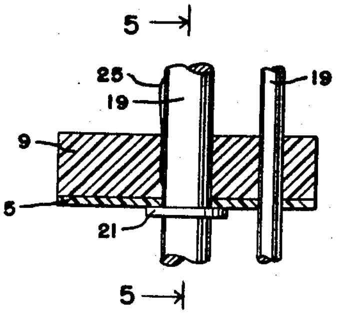

The novel features characteristic of the present invention, as well as additional objects and advantages thereof, will be understood better from the following detailed description when read in connection with the accompanying drawing in which, Figure 1 is a side view of a completed electronic unit of the type to which the method of the present invention is applicable, Figure 2 is a top plan view of the unit shown in Figure 1, Figure 3 is a side view of an initial step in practicing the method of the present invention, Figure 4 is a view, similar to Figure 3, of a subsequent step, showing the catacomb disposed above the first end plate, portions thereof being shown in section and other portions being shown in elevation, Figure 5 is a sectional view, taken along the line 5—5 of Figure 4, showing components inserted within the catacomb, Figure 6 is a view, similar to Figure 5, showing a subsequent step with the second end plate in position above the component leads, Figure 7 is a view, similar to Figure 6, showing a step subsequent thereto with the catacomb raised, Figure 8 is a view, similar to Figure 7, showing the position of parts during raising of the first end plate, and Figure 9 is a view of the assembly subsequent to raising the first end plate substantially into abutment with the catacomb.

Referring more particularly to the drawing, wherein similar reference characters are used to designate corresponding parts throughout, the method of assembly of the present invention is illustrated with respect to an electronic unit 1. The electronic unit selected as a preferred example, is one commonly referred to as a composite "sandwich" type unit wherein the components 3 are disposed and supported in parallel, spaced-apart relation between two plates 5, 7.

A catacomb 9 is provided to facilitate supporting the components as well as to aid in assembly of the composite unit. The catacomb may be made from any suitable material. However, in the case of an electronic unit, it would be preferable to employ an insulating material for obvious reasons. The catacomb is provided with a plurality of openings 11 which extend therethrough and are of a size to freely receive the components 3. The thickness of the catacomb, that is, the measurement from top to bottom as viewed in the drawing, is governed by the maximum length of the body portion of the components and should be sufficient to contain the entire bodies of the components. The arrangement of the apertures is governed by whatever relation the parts are to assume to satisfy the particular requirements for which the unit is designed.

The end plates 5, 7, hereinafter referred to as the first end plate 5 and the second end plate 7, are made from any suitable material. If the unit is an electronic assembly, as illustrated in the drawing, the material obviously should be an insulating type. Both end plates are provided with a plurality of apertures or openings 13 extending therethrough. The openings are arranged to correspond with the location of the catacomb openings in order to receive the leads 15 of the components.

If the unit is an electronic assembly, electrical connections 17 may be provided on one or both faces of the end plates. In such case, the connections are arranged to extend between selected openings for the purpose of connecting the components in accordance with a particular circuit for which the unit is designed.

In order to facilitate assembly of the unit, one or more spindles 19 may be utilized to support and maintain the parts in proper orientation. At least one of the spindles should be provided with a shoulder 21 on which the first end plate is to be supported during early stages of assembly. In order to accommodate these spindles, the catacomb and end plates are provided with appropriate spindle receiving openings 23.

Assembly of the unit in accordance with the method of the present invention is accomplished in the following manner. The catacomb 9 is supported above the first end plate 5 with the respective openings thereof aligned. As shown in the drawing, if spindles 19 are employed, the first end plate 5 is placed on the spindles for support by and above the shoulder 21, as shown in Figure 3. The catacomb 9 is then mounted on the spindles above and substantially in contact with the first end plate, as illustrated in Figure 4.

Following this, the components are inserted into their respective openings 11 in the catacomb 9 with the leads 15 thereof to be associated with the first end plate extending downwardly through the openings 13 in that end plate, in the manner shown in Figure 5 of the drawing.

In order to facilitate inserting or threading the component leads 15 through the first end plate openings and to dispose the component bodies within the catacomb, the assembly may be subjected to vibrating. Employing such a technique quickly and easily takes care of assembling together all the components at one time rather than manually threading the components into place one at a time. In addition, the vibrating technique lends itself readily to automatic assembly methods.

As a further facility to threading the components into the second end plate openings, it will be found preferable to foreshorten the leads to be associated with the second end plate. The leads should be made as short as possible, perhaps to a length which will terminate them at substantially the same distance from the first end plate after the components are first inserted into the catacomb openings. It will be recognized that the shorter the lead length, the better orientation can be expected with respect to the second end plate openings. The length of lead in any case will, of course, be governed by the amount which is necessary to extend through the second end plate once it is substantially abutted with the catacomb and permit proper attachment thereto.

Once the components are disposed within their respective catacomb openings, the next step is to place the second end plate 7 in a position which will support it above the upwardly extending leads 15 and with the openings 13 thereof oriented with respect to the catacomb openings 11. The position of parts will then assume the relationship shown in Figure 6 of the drawing.

Following this, the catacomb 9 is then moved upwardly away from the first end plate 5 substantially into abutment with the second end plate while the component leads associated within the first end plate openings are retained therein. By moving the catacomb into abutment with the second end plate, the catacomb functions as a pilot or guide to assist in orienting the leads for threading into the second end plate openings. Upward movement of the catacomb preferably should be limited to an extent not to exceed the upper limits of the body portion of the shortest component. The reason for this is to prevent the short components from engaging the lower periphery of the catacomb openings as the components are moved upwardly during a subsequent operation. Thus, foreshortening the upwardly extending leads should also take into account the extent of upward travel of the catacomb.

In completing the final stages of assembling the unit, it is necessary to successful handling that the second end plate and catacomb be maintained substantially in abutment. Any means may be provided for this purpose, either on the unit parts themselves or independent thereof. For illustrative purposes, the center spindle 19 is shown provided with a spring 25 disposed longitudinally thereof. The spring operates to hold the parts supported in position while the remainder of the assembling is being accomplished.

The final stage of bringing the parts together in "sandwich" fashion is to move the first end plate 5 upwardly until it substantially abuts the lower face of the catacomb 9. In so doing, the first end plate will urge the components upwardly while the upwardly extending leads are simultaneously urged or threaded through the second end plate openings. In like manner as explained above, vibration of the assembly may be employed to assist threading the leads into their respective second end plate openings while the first end plate and components are being influenced upwardly.

Once the first end plate 5 is in position substantially abutted with the catacomb, the position shown in Figure 9 of the drawing, the assembly is then ready for attachment of the leads to the end plates thereby to hold the parts together. In the case of an electrical unit, the leads 15 are then attached to the electrical connections 17 on the faces of the end plates, employing any suitable techniques desired. The dip soldering technique is appropriate and found to be particularly suitable for this type of unit because, with a single dipping, a multiplicity of connections can be made. Once the leads are attached, the excess portions should then be removed and the unit will appear, as shown in Figures 1 and 2, with the components disposed within the catacomb in spaced apart, parallel relation and with their leads extending through and connected to a pair of end plates.

The foregoing description of the present invention is specifically related to a preferred embodiment of an electrical unit or assembly and describes a simple, fast method of putting together a plurality of components into a composite unit of the "sandwich" type. It will be recognized, of course, by those persons skilled in the art that the method steps outlined herein are applicable to other composite units of similar structural relation and that changes and modifications in the method steps themselves or in the sequence are entirely possible within the spirit of the present invention. For example, the openings in the end plates may be tapered on the ends thereof adjacent to the catacomb to facilitate threading the component leads therethrough. Also the assembly may be constructed and arranged to accommodate vacuum tubes or electrical components other than resistors or condensers. Therefore, it is desired that the particular form of the present invention shown and described herein be considered as illustrative and not as limiting.

I claim:

1. The method of assembling a plurality of electrical components which have leads extending from at least one end thereof into a unit, which method comprises the steps of providing a catacomb having a plurality of openings of larger diameter than that of said components and disposed parallel to each other and extending therethrough, providing first and second end plates for said catacomb having openings therethrough correspondingly located with respect to said catacomb openings, supporting said catacomb above said first end plate with the openings thereof aligned, inserting the electrical components into said catacomb openings while threading the component leads to be associated with said first end plate through the openings in that plate, supporting said second end plate above the component leads to be associated therewith with the openings aligned to receive those leads, moving said catacomb away from said first end plate substantially into contact with said second end plate while maintaining the component leads within the openings in said first end plate, moving said first end plate upwardly substantially into contact with said catacomb thereby to thread the component leads associated with said second end plate through the openings in that plate and to dispose the components within said catacomb openings, and attaching said leads to the end plates associated therewith.

2. The method of assembling a plurality of electrical components which have leads extending from at least one end thereof into a unit, which method comprises the steps of providing a catacomb having a plurality of openings of larger diameter than that of said components and disposed parallel to each other and extending therethrough, providing first and second end plates for said catacomb having openings therethrough correspondingly located with respect to said catacomb openings, supporting said catacomb above said first end plate with the openings thereof aligned, inserting the electrical components into said catacomb openings while threading the component leads to be associated with said first end plate through the openings in that plate, supporting said second end plate above the component leads to be associated therewith with the openings aligned to receive those leads, moving said catacomb away from said first end plate substantially into contact with said second end plate while maintaining the component leads within the openings in said first end plate, simultaneously moving said first end plate upwardly substantially into contact with said catacomb while vibrating the entire assembly thereby to thread the component leads associated with said second end plate through the openings in that plate and to dispose the components within said catacomb openings, and attaching said leads to the end plates associated therewith.

3. The method of assembling a plurality of electrical components which have leads extending from at least one end thereof into a unit, which method comprises the steps of providing a catacomb having a plurality of openings of larger diameter than that of said components and disposed parallel to each other and extending therethrough, providing first and second end plates for said catacomb having openings therethrough correspondingly located with respect to said catacomb openings, foreshortening the component leads to be associated with said second end plate to predetermined lengths, supporting said catacomb above said first end plate with the openings thereof aligned, inserting the electrical components into said catacomb openings while threading the component leads to be associated with said first end plate through the openings in that plate, supporting said second end plate above the foreshortened leads with the openings thereof aligned to receive those leads, moving said catacomb away from said first end plate substantially into contact with said second end plate while maintaining the component leads within the openings in said first end plate, moving said first end plate upwardly substantially into contact with said catacomb thereby to thread the foreshortened leads through the openings in said second end plate and to dispose the components within said catacomb openings, and attaching said leads to the end plates associated therewith.

4. The method of assembling a plurality of electrical components which have leads extending from at least one end thereof into a unit, which method comprises the steps of providing a catacomb having a plurality of openings of larger diameter than that of said components and disposed parallel to each other and extending therethrough, providing first and second end plates for said catacomb having openings therethrough correspondingly located with respect to said catacomb openings, foreshortening the component leads to be associated with said second end plate to predetermined lengths, supporting said catacomb above said first end plate with the openings thereof aligned, inserting the electrical components into said catacomb openings while threading the component leads to be associated with said first end plate through the openings in that plate, supporting said second end plate above the foreshortened leads with the openings thereof aligned to receive those leads, moving said catacomb away from said first end plate substantially into contact with said second end plate while maintaining the component leads within the openings in said first end plate, simultaneously moving said first end plate upwardly substantially into contact with said catacomb while vibrating the entire assembly thereby to thread the foreshortened leads through the openings in said second end plate and to dispose the components within said catacomb openings, and attaching said leads to the end plates associated therewith.

5. The method of assembling a plurality of electrical components which have leads extending from at least one end thereof into a unit, which method comprises the steps of providing a catacomb having a plurality of openings of larger diameter than that of said components and disposed parallel to each other and extending therethrough, providing first and second end plates for said catacomb having openings therethrough correspondingly located with respect to said catacomb openings, foreshortening the component leads to be associated with said second end plate to predetermined lengths, supporting said catacomb above said first end plate with the openings thereof aligned, inserting the electrical components into said catacomb openings while threading the component leads to be associated with said first end plate through the openings in that plate, supporting said second end plate above the foreshortened leads wth the openings thereof aligned to receive those leads, moving said catacomb away from said first end plate to an extent not to exceed the upper limits of the body portion of the shortest component and substantially into contact with said second end plate, moving said first end plate upwardly substantially into contact with said catacomb thereby to thread the foreshortened leads through the openings in said second end plate and to dispose the components within said catacomb openings, and attaching said leads to the end plates associated therewith.

6. The method of assembling a plurality of electrical components which have leads extending from at least one end thereof into a unit, which method comprises the steps of providing a catacomb having a plurality of openings of larger diameter than that of said components and disposed parallel to each other and extending therethrough, providing first and second end plates for said catacomb having openings therethrough correspondingly located with respect to said catacomb openings, foreshortening each of the component leads to be associated with said second end plate to an extent such as to terminate at substantially the same distance from said first end plate in the assembly, supporting said catacomb above said first end plate with the openings thereof in alignment, inserting the electrical components into said catacomb openings while threading the leads thereof to be associated with said first end plate through the openings in that plate, supporting said second end plate above the foreshortened leads, moving said catacomb away from said first end plate to an extent limited by the upper end of the body portion of the shortest component, moving said first end plate upwardly substantially into contact with said catacomb while threading the foreshortened leads through the openings in said second end plate thereby to dispose the components within said catacomb openings with the leads thereof extending through the openings in the end plates, and attaching said leads to the ends plates associated therewith.

No references cited.